United States Patent
Ukai et al.

(10) Patent No.: US 10,418,956 B2
(45) Date of Patent: Sep. 17, 2019

(54) SIGNAL PROCESSING APPARATUS, SPEAKER APPARATUS, AND SIGNAL PROCESSING METHOD

(71) Applicant: Yamaha Corporation, Hamamatsu-shi, Shizuoka-Ken (JP)

(72) Inventors: Satoshi Ukai, Hamamatsu (JP); Mikio Muramatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/880,580

(22) Filed: Jan. 26, 2018

(65) Prior Publication Data
US 2018/0152159 A1     May 31, 2018

Related U.S. Application Data

(63) Continuation of application No. PCT/JP2015/073712, filed on Aug. 24, 2015.

(51) Int. Cl.
    *H03G 11/04*     (2006.01)
    *H03G 3/30*     (2006.01)
    (Continued)

(52) U.S. Cl.
    CPC ........... *H03G 3/301* (2013.01); *H03G 3/3089* (2013.01); *H03G 7/002* (2013.01); *H03G 7/007* (2013.01); *H03G 11/008* (2013.01); *H03G 11/04* (2013.01)

(58) Field of Classification Search
    CPC ...... H03G 11/008; H03G 11/04; H03G 3/301; H03G 3/3089; H03G 7/002; H03G 7/007
    (Continued)

(56) References Cited

U.S. PATENT DOCUMENTS

2006/0212636 A1*   9/2006   Yasuo ..................... G06F 1/263
                                                              710/303
2007/0247206 A1*   10/2007   Vook .................... H03H 11/265
                                                              327/261
(Continued)

FOREIGN PATENT DOCUMENTS

EP     2 197 105 A1     6/2010
JP     56-109012 A     8/1981
(Continued)

OTHER PUBLICATIONS

JP2011155437 (A)—Aug. 11, 2011, Watanabe, Voice Processing Device and Voice Processing Metod,Victor Company of Japan, 11 pages. (Year: 2011).*

(Continued)

*Primary Examiner* — Vivian C Chin
*Assistant Examiner* — Friedrich Fahnert
(74) *Attorney, Agent, or Firm* — Crowell & Moring LLP

(57) ABSTRACT

A signal processing apparatus includes a level adjuster adjusting a level of an input signal, and a setter calculating an electric charge estimate value being a value obtained by estimating an electric charge amount of a charging and discharging element based on the charging and discharging element to which a predetermined electric charge is supplied and in which the electric charge is held and the electric charge supplied to the charging and discharging element and setting an adjustment coefficient of the level adjuster based on the electric charge estimate value.

24 Claims, 11 Drawing Sheets

(51) Int. Cl.
*H03G 7/00* (2006.01)
*H03G 11/00* (2006.01)

(58) Field of Classification Search
USPC .......................................................... 381/59
See application file for complete search history.

(56) References Cited

U.S. PATENT DOCUMENTS

| 2010/0246857 | A1 | 9/2010 | Kajita | |
| 2014/0266785 | A1* | 9/2014 | Miller | H04B 5/0043 340/870.04 |

FOREIGN PATENT DOCUMENTS

| JP | 59-40713 A | 3/1984 |
| JP | 8-242173 A | 9/1996 |
| JP | 2009-17725 A | 1/2009 |
| JP | 2009-94684 A | 4/2009 |
| JP | 2009-141670 A | 6/2009 |
| JP | 2009-159433 A | 7/2009 |
| JP | 2011-155437 A | 8/2011 |

OTHER PUBLICATIONS

International Search Report (PCT/ISA/210) issued in PCT Application No. PCT/JP2015/073712 dated Oct. 6, 2015 with English translation (4 pages).
Japanese-language Written Opinion (PCT/ISA/237) issued in PCT Application No. PCT/JP2015/073712 dated Oct. 6, 2015 (3 pages).
Partial Supplementary European Search Report issued in counterpart European Application No. 15902229.2 dated Feb. 27, 2019 (14 pages).
Partial Supplementary European Search Report issued in counterpart European Application No. 15902229.2 dated Jun. 17, 2019 (15 pages).

\* cited by examiner

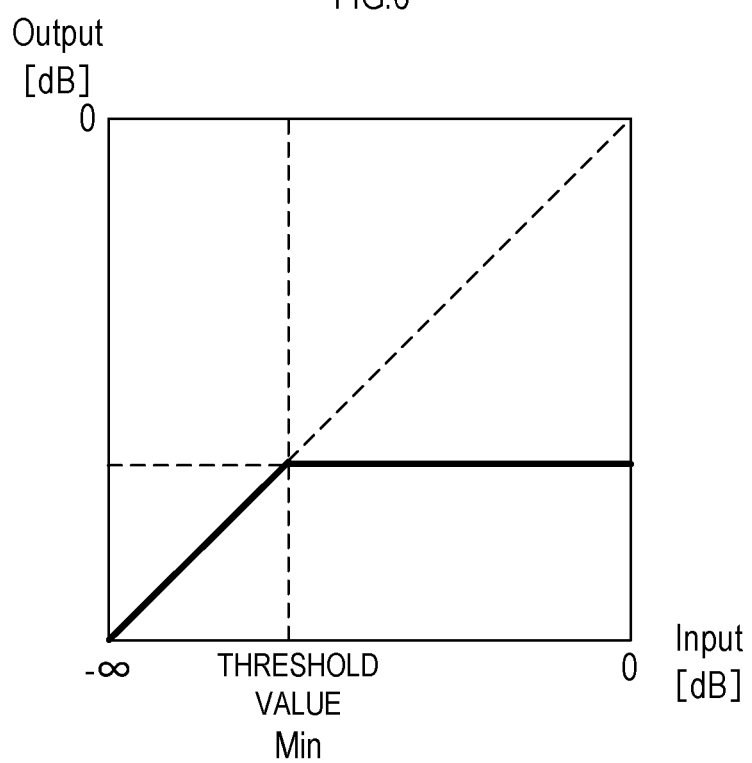

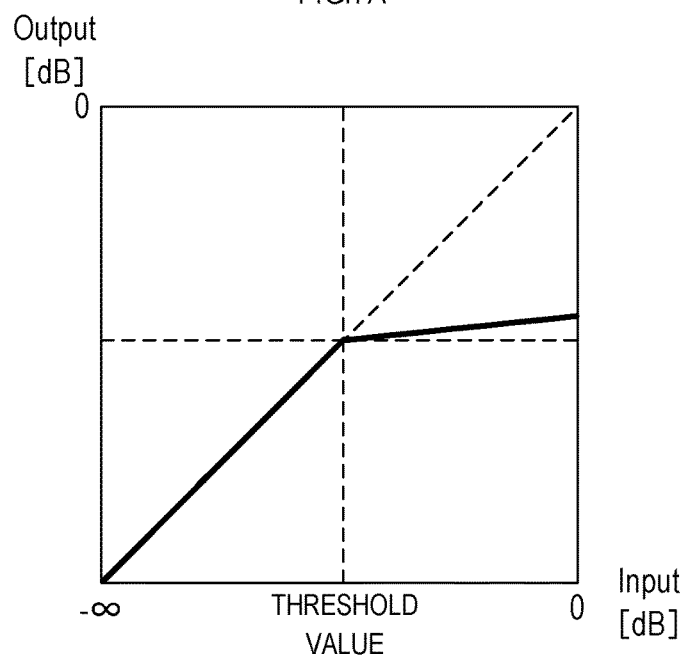
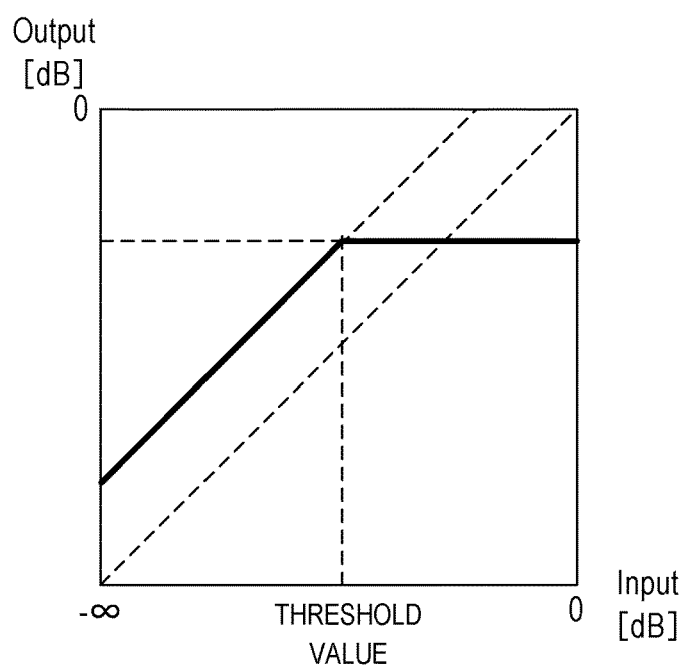

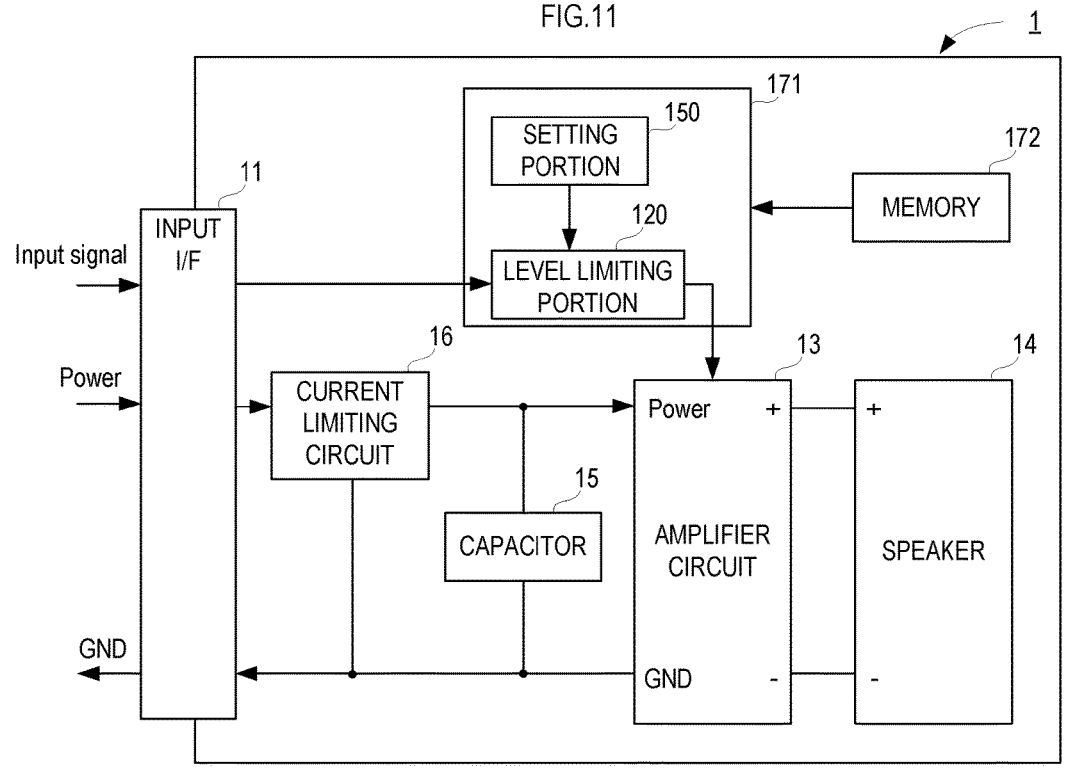

SIGNAL PROCESSING APPARATUS, SPEAKER APPARATUS, AND SIGNAL PROCESSING METHOD

CROSS REFERENCE TO RELATED APPLICATIONS

The present application is a continuation of International application Ser. No. PCT/JP2015/073712, filed on Aug. 24, 2015, the entire content of which is incorporated herein by reference.

BACKGROUND OF THE INVENTION

1. Field of the Invention

The present invention relates to a signal processing apparatus, a speaker apparatus, and a signal processing method that adjust a level of an input signal.

2. Description of the Related Art

The USB standard is able to transmit and receive data and supply electric power through one physical interface. However, in the USB standard, only a predetermined current (about 500 mA, for example) is able to be supplied. Thus, in a device for which a large current is instantaneously required, such as a power amplifier, for example, electric power supply amount has been insufficient in some cases.

Therefore, for example, Japanese Unexamined Patent Application Publication No. 2009-94684 discloses an electronic device capable of instantaneously supplying a large current also in a USB bus-powered electric power supply by connecting a capacitor. The electronic device of Japanese Unexamined Patent Application Publication No. 2009-94684 prevents a power amplifier from stopping by detecting the voltage of the capacitor and limiting the level of a signal that is input to the power amplifier according to a detected voltage value.

In addition, conventionally, a device limiting the level of an input signal in order to prevent excessive current has been known. For example, an amplifier circuit of Japanese Unexamined Patent Application Publication No. S59-040713 detects the output current of a load circuit in a current detecting circuit, and performs level limit according to the output current of the load circuit in an amplitude control circuit.

In addition, an amplifying apparatus of Japanese Unexamined Patent Application Publication No. 2009-159433 detects the output current and power supply voltage of a load circuit (an amplifier circuit), and determines a clip detection reference level. Then, in a case in which the level of an input signal is larger than the clip detection reference level, the level limit of the input signal is performed.

However, conventional devices need new hardware detecting the output current and power supply voltage of a load circuit or the voltage of a capacitor.

SUMMARY OF THE INVENTION

Therefore, an object of the present invention is to provide a signal processing apparatus, a speaker apparatus, and a signal processing method that are able to perform level adjustment without being provided with new hardware.

A signal processing apparatus comprising at least one processor configured to implement stored instructions and execute a plurality of tasks including, a level adjusting task adjusting a level of an input signal, and a setting task calculating an electric charge estimate value being a value obtained by estimating an electric charge amount of a charging and discharging element based on an electric charge supplied to the charging and discharging element and a consumption electric charge calculated by a level of the input signal to which the level adjusting task has performed level adjustment and setting an adjustment coefficient of the level adjusting task based on the electric charge estimate value.

According to the present invention, level adjustment is able to be performed without providing new hardware.

The above and other elements, features, characteristics, and advantages of the present invention will become more apparent from the following detailed description of the preferred embodiments with reference to the attached drawings.

BRIEF DESCRIPTION OF THE DRAWINGS

FIG. 6 illustrates an example of a gain table.

FIG. 7A illustrates an example of a gain table.

FIG. 7B illustrates an example of a gain table.

FIG. 11 is a flow chart showing an operation of a signal processing apparatus.

DETAILED DESCRIPTION OF THE PREFERRED EMBODIMENTS

A setting portion of a signal processing apparatus calculates a consumption electric charge from the level of an input signal to be input to a load circuit (an amplifier circuit, for example) provided in the subsequent stage, and estimates a current electric charge amount in the charging and discharging element (a capacitor, for example). Then, the setting portion sets an attenuation rate of the input signal according to the estimated current electric charge amount. The setting portion does not need to detect a voltage of a capacitor directly since only performing calculation from the level of the input signal to which the level limit has been performed. In addition, the setting portion does not need to detect the output current of the load circuit directly or does not need to measure a power supply voltage directly. Thus, the signal processing apparatus does not need to be provided with new hardware detecting the output current and power supply voltage of the load circuit and the power source of the capacitor.

Figure 1:
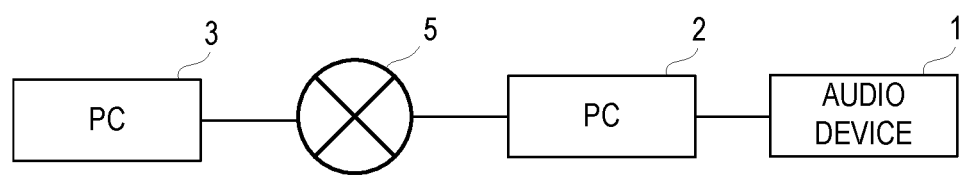
FIG. 1 is a block diagram illustrating a configuration of an audio conferencing system.

FIG. 1 is a block diagram illustrating a configuration of an audio conferencing system. The audio conferencing system transmits and receives sound information (a packet) bi-directionally between a personal computer (PC) 2 and a PC 3 connected through the Internet 5 and conducts an audio conference.

The PC 2 is connected to an audio device 1. The audio device 1 and the PC 2 are connected through a USB interface, for example. The PC 2 decodes the packet received from the PC 3 and converts the packet into a digital sound signal. The PC 2 inputs the digital sound signal to the audio device 1. In addition, the PC 2 supplies electric power to the audio device 1 by USB bus power.

Figure 2:
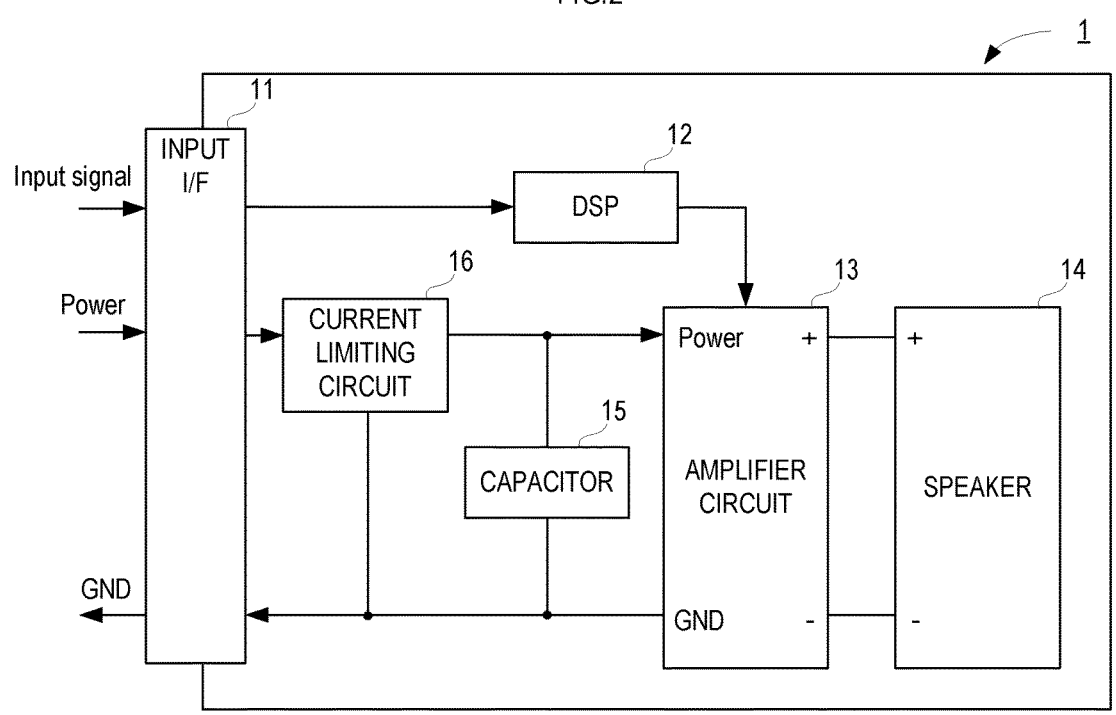
FIG. 2 is a block diagram illustrating a configuration of a speaker apparatus.

FIG. 2 is a block diagram illustrating a main configuration of the audio device 1. The audio device 1 is provided with an input interface (I/F) 11, a DSP 12, an amplifier circuit 13, a speaker 14, a capacitor 15, and a current limiting circuit 16. It is to be noted that, while the audio device 1 is a speaker apparatus with which a microphone is not provided in the present preferred embodiment, in practice, the audio device 1 is provided with a microphone not shown, and is provided with the function of outputting a digital sound signal according to the sound by which the microphone has picked, to the PC 2.

The input I/F 11 is a USB interface, for example. The input I/F 11 inputs a digital sound signal (Input signal) from the PC 2. In addition, the input I/F 11 supplies a current (Power) to be supplied from the PC 2 to the amplifier circuit 13 through the current limiting circuit 16. In addition, the input I/F 11 is connected to the ground line (GND) of the amplifier circuit 13 and performs grounding through the PC 2.

It is to be noted that, while the USB interface performs the input and output of a signal and the supply of electric power through one physical interface, the input and output of a signal and the supply of electric power may be performed through respective different physical interfaces. However, the audio device 1, by using a USB interface, is able to be connected to the PC 2 through only one physical interface. Thus, for a user, the audio conference is able to be conducted more easily.

The DSP 12 is an example of the signal processing apparatus of the present invention. The DSP 12 performs various kinds of processing (level limit processing in this example) to an input digital sound signal. The DSP 12 outputs the digital sound signal of which the level has been limited, to the amplifier circuit 13.

The amplifier circuit 13 amplifies the digital sound signal to be output from the DSP 12 by the electric power to be supplied from the capacitor 15 or the current limiting circuit 16. Then, the amplifier circuit 13 converts the digital sound signal that has been amplified into an analog sound signal and drives the speaker 14. As a result, the audio device 1 is able to cause the sound transmitted from the PC 3 of a remote place to be heard by the user of the PC 2 and the audio device 1.

The current limiting circuit 16 limits the current to be supplied from the PC 2, to a predetermined current value. The current limiting circuit 16 limits the current to be supplied from the PC 2, to the current value of 500 mA, when applying the USB standard, for example.

The current limiting circuit 16 is connected to the capacitor 15 and the amplifier circuit 13. The capacitor 15 is an example of the charging and discharging element of the present invention, and holds the electric charge to be supplied from the current limiting circuit 16. It is to be noted that the charging and discharging element may not be limited to a capacitor and may be a rechargeable battery, for example.

Figure 3:
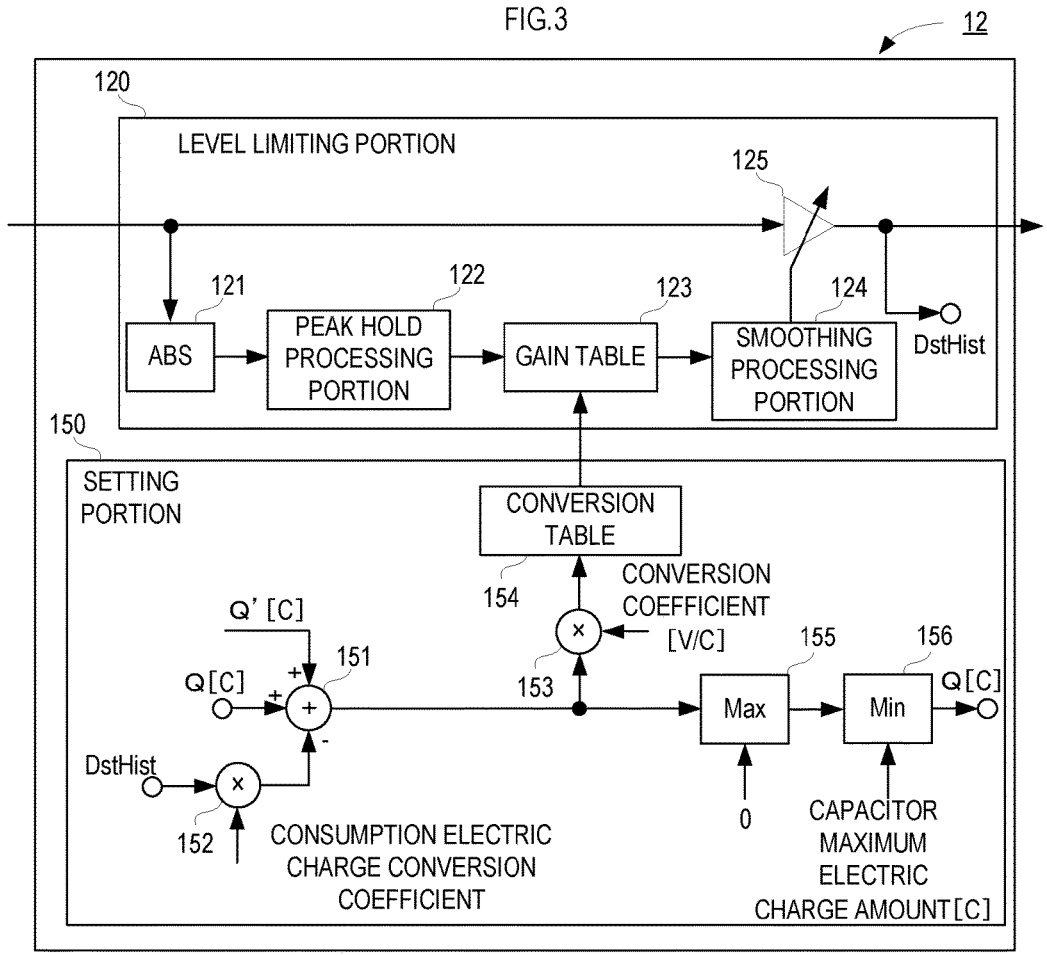
FIG. 3 is a block diagram illustrating a configuration of a signal processing circuit.
Figure 10:
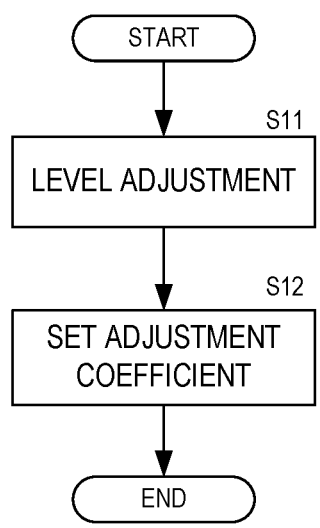
FIG. 10 is a block diagram illustrating an example in which a setting portion 150 is implemented by a CPU.

Subsequently, FIG. 3 is a functional block diagram of the DSP 12. The DSP 12 is functionally provided with a level limiting portion (a level adjuster) 120 and a setting portion (a setter) 150. FIG. 10 is a flow chart showing an operation of the level limiting portion 120 and the setting portion 150. In the audio device 1, the level limiting portion 120 performs level adjustment (S11), and the setting portion 150 sets an adjustment coefficient of the level limiting portion 120 (S12).

The level limiting portion 120 is a compressor performing the level limit of an input signal. The level limiting portion 120 is provided with an absolute value processing portion (ABS) 121, a peak hold processing portion 122, a gain table 123, a smoothing processing portion 124, and a gain adjuster 125.

The digital sound signal that has been input to the DSP 12 is input to the gain adjuster 125. The gain adjuster 125 limits the level of the digital sound signal at a set attenuation rate. The attenuation rate of the gain adjuster 125 is determined by the gain table 123. The digital sound signal of which the level has been limited is output to the amplifier circuit 13 and the setting portion 150 provided in the subsequent stage.

In addition, the digital sound signal that has been input to the DSP 12 is also input to the ABS 121. The ABS 121 changes the amplitude value of the input digital sound signal to an absolute value, and outputs the value to the peak hold processing portion 122.

The peak hold processing portion 122 smooths the level value of the digital sound signal that has been input from the ABS 121 and converts instantaneous amplitude into effective amplitude. The peak hold processing portion 122 corresponds to a decay or release time of a compressor. The level value of the digital sound signal smoothed by the peak hold processing portion 122 is input to the gain table 123.

The gain table 123 is a table that determines the level value of an output signal to the level value of an input signal, and sets the attenuation rate of the gain adjuster 125. The details will be described below. The attenuation rate determined by the gain table 123 is input to the smoothing processing portion 124.

The smoothing processing portion 124 is a primary IIR low pass filter. The smoothing processing portion 124 corresponds to an attack time constant in a compressor. The attack time constant indicates how soon the level limit processing starts to be effective. If the level limit processing is started immediately, sound will be distorted and the quality of the sound will deteriorate. Therefore, the level limiting portion 120 may preferably perform smoothing in the smoothing processing portion 124.

Subsequently, the setting portion 150 is a function portion that sets the gain table 123 in the level limiting portion 120. The setting portion 150 sets the gain table 123 according to an integrated value obtained by integrating the electric charge supplied to the capacitor 15 and a consumption electric charge calculated by the level of the digital sound signal of which the level has been limited by the level limiting portion 120. The setting portion 150 is provided with an adder 151, a multiplier 152, a multiplier 153, a conversion table 154, a lower limit setting portion (Max) 155, and an upper limit setting portion (Min) 156.

To begin with, the digital sound signal of which the level has been limited by the gain adjuster 125 is input to the multiplier 152. However, while illustration is omitted, the digital sound signal (digital sound signal prior to one sample) that is delayed by only one sample (or two or more samples) is input to the multiplier 152.

The multiplier 152 multiplies the input digital sound signal by a consumption electric charge conversion coefficient. A charge amount to be consumed by the capacitor 15, to the level (unit voltage) of a digital sound signal, is set up previously to the consumption electric charge conversion coefficient. As a result, the multiplier 152 calculates the consumption electric charge of the capacitor 15.

The adder 151 inputs the consumption electric charge of the capacitor 15 calculated by the multiplier 152, an electric charge Q' [C] supplied to the capacitor 15, and an electric charge estimate value Q [C] of the capacitor 15 being a calculation result prior to one sample (or two or more samples). The initial value of the electric charge estimate value Q [C] of the capacitor 15 is 0 [C]. The electric charge Q' [C] to be supplied to the capacitor 15 is indicated by a constant. In this example, the electric charge Q' [C], when the current of 500 mA is supplied, corresponds to the charge amount to be supplied in time of one sample. The consumption electric charge changes with the levels of the digital sound signal to be supplied to the amplifier circuit 13 as described above.

The adder 151 calculates a current electric charge estimate value Q [C] of the capacitor 15 by adding the electric charge Q' [C] supplied to the capacitor 15, to a current electric charge estimate value Q [C] of the capacitor 15 being a calculation result prior to one sample and also by subtracting the consumption electric charge of the capacitor 15 calculated by the multiplier 152. A calculated electric charge estimate value Q [C] is input to the multiplier 153 and the lower limit setting portion 155.

The lower limit setting portion 155 sets the electric charge estimate value Q [C] to 0 [Q] when the calculated electric charge estimate value Q [C] is less than zero so that the minimum value of the electric charge estimate value Q [C] may become 0. In addition, the upper limit setting portion 156 sets the electric charge estimate value Q [C] to an electric charge value [Q] corresponding to the maximum capacity of the capacitor when the calculated electric charge estimate value Q [C] is greater than an electric charge corresponding to the maximum capacity of the capacitor 15 so that the maximum value of the electric charge estimate Q [C] becomes an electric charge corresponding to the maximum capacity of the capacitor 15.

Since the DSP 12 in the present preferred embodiment is configured to be built in the audio device 1 being a speaker apparatus for conducting an audio conference, the sound signal related to a human voice is input. At the audio conference, the human voice breaks off frequently because of breathing or like and has long silent time. Thus, the audio device 1 has the high frequency at which the electric charge of the capacitor 15 becomes the maximum value even if a sound signal of an instantaneously large level is input. Corresponding to such a situation, the setting portion 150, by the upper limit setting portion 156, limits the maximum value so that the maximum value of the electric charge estimate value Q [C] may become the electric charge corresponding to the maximum capacity of the capacitor 15, the calculated electric charge estimate value Q [C] and the charge amount of an actual capacitor are not largely deviated.

Subsequently, the multiplier 153, by multiplying the electric charge estimate value Q [C] by a conversion coefficient [V/C], converts the electric charge estimate value Q [C] into a current voltage estimate value [V] of the capacitor 15. The voltage estimate value [V] is input to the conversion table 154.

Figure 4:
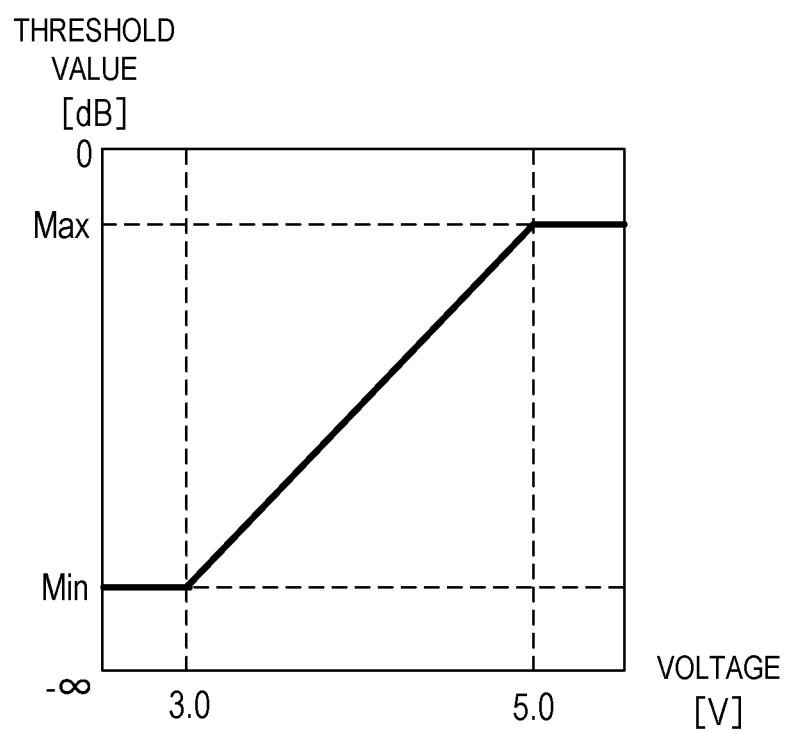
FIG. 4 illustrates an example of a conversion table.

FIG. 4 illustrates an example of the conversion table. The horizontal axis of a graph illustrated in FIG. 4 is voltage [V], and a vertical axis is a threshold value [dB]. The voltage [V] on the horizontal axis corresponds to the voltage estimate value [V]. In this example, the conversion table 154, in a case in which the voltage estimate value [V] is 5 V or more, determining a state in which the amplifier circuit 13 is able to stably drive, sets a threshold value to the maximum value (Max). In addition, the conversion table 154 associates the minimum voltage (3 V in this example) by which the amplifier circuit 13 is able to stably drive with the minimum (Min) of a threshold value. While a voltage value is from 3 V to 5 V, a threshold value is set so as to change in proportion to change in voltage.

In this manner, the voltage estimate value [V] that has been input to the conversion table 154 is converted into a threshold value [dB] corresponding to the level value of a digital sound signal by the conversion table illustrated in FIG. 4.

Figure 5A:
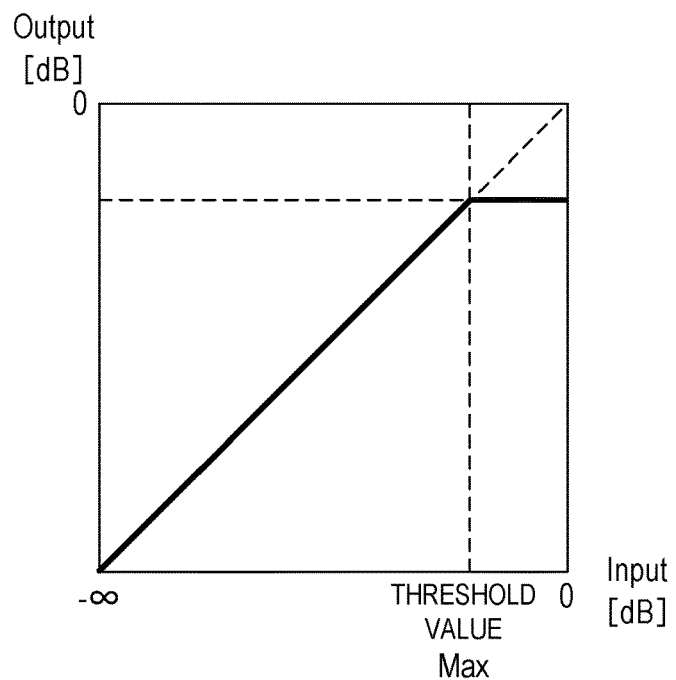
FIG. 5A illustrates an example of a gain table.
Figure 5B:
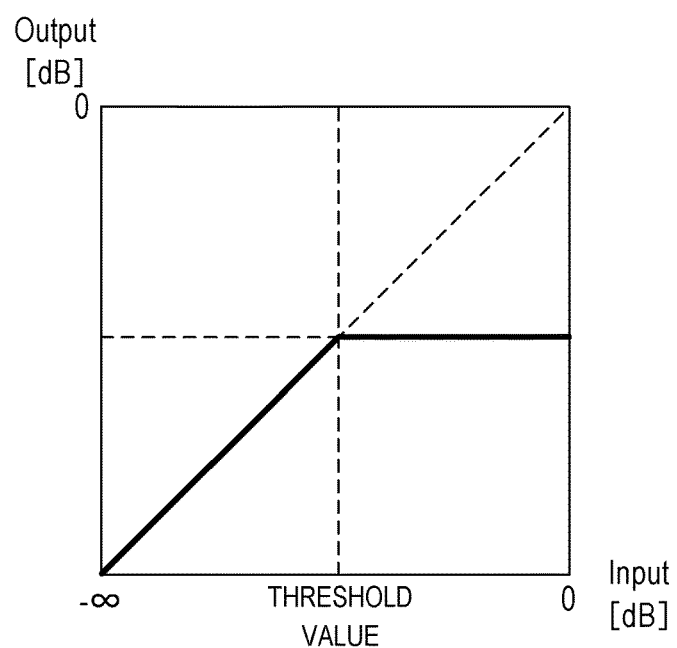
FIG. 5B illustrates an example of a gain table.

The threshold value [dB] converted by the conversion table 154 is input to the gain table 123. FIG. 5A and FIG. 5B are each an example of a gain table. The horizontal axis illustrated in FIG. 5A and FIG. 5B indicates a value [dB] of the input level to the gain table 123, and the vertical axis indicates a value [dB] of the output level of the gain table 123.

To begin with, the example of FIG. 5A illustrates a gain conversion table in a case in which the threshold value [dB] converted by the conversion table 154 is the maximum value (Max). As illustrated in FIG. 5A, in a case in which the value of the input level is not less than a threshold value [dB] at the gain table 123, the value of the output level is limited to the threshold value [dB]. In this manner, the attenuation rate determined by the gain table 123 is set to the gain adjuster 125 through the smoothing processing portion 124.

Then, as illustrated in FIG. 5B, in a case in which the voltage estimate value [V] of the capacitor 15 decreases, the threshold value [dB] also decreases as illustrated in the conversion table 154, the value of the output level is limited to a lower value. In addition, as illustrated in FIG. 6, in a case in which the voltage estimate value [V] is set to 3 V, the value of the output level is limited to the minimum value (Min) of the threshold value. In other words, the attenuation rate of the gain adjuster 125 is set to the maximum.

In the present preferred embodiment, the minimum value (Min) of the threshold value illustrated in FIG. 6 is set to the level to which the voltage of the capacitor does not decrease even when the amplifier circuit 13 drives. In other words, the attenuation rate of the gain adjuster 125 is a value against which the consumption electric charge calculated by the multiplier 152, and the electric charge Q' [C] supplied to the capacitor 15 are balanced. As a result, the state in which the amplifier circuit 13 is able to stably drive is maintained.

As described above, the setting portion 150 calculates a consumption electric charge from the level of the sound signal to be input to the amplifier circuit 13 and estimates a current electric charge amount in the capacitor 15. Then, the setting portion 150 sets the attenuation rate of the gain adjuster 125 according to the estimated current electric charge amount of the capacitor 15. The setting portion 150 does not need to detect a voltage of the capacitor 15 directly since only performing calculation from the level of the input signal to which the level limit has been performed in the gain adjuster 125. In addition, the setting portion 150 does not need to detect the output current of the amplifier circuit 13 directly or does not need to measure a power supply voltage directly. Thus, the audio device 1 does not need to be provided with new hardware detecting the output current and power supply voltage of the amplifier circuit 13 and the power source of the capacitor 15, and is able to perform an appropriate level limit according to the state of the capacitor.

Subsequently, FIG. 7A illustrates a modification example of a gain table. While, in FIG. 5A, FIG. 5B, and FIG. 6, the example (the example in which the DSP 12 operates as a limiting circuit) in which a value of the output level is limited to a threshold value is illustrated, in a case in which, in the example of FIG. 7A, a value of the input level is not less than the threshold value [dB], the value of the output level is limited so that the change of the decibel value of the output level to the change of the decibel value of the input level may become a predetermined ratio (about 1/10, for example) greater than zero. As a result, the audio device 1 is able to reduce distortion in a large volume range and further reduce the uncomfortable feeling of a listener.

In addition, in the example of FIG. 7B, to the level of an input signal, the level of a low volume is increased by increasing the level of an output signal. In such a case, the audio device 1, in a low volume range, is able to prevent a situation in which sound is difficult to be heard.

Figure 8:
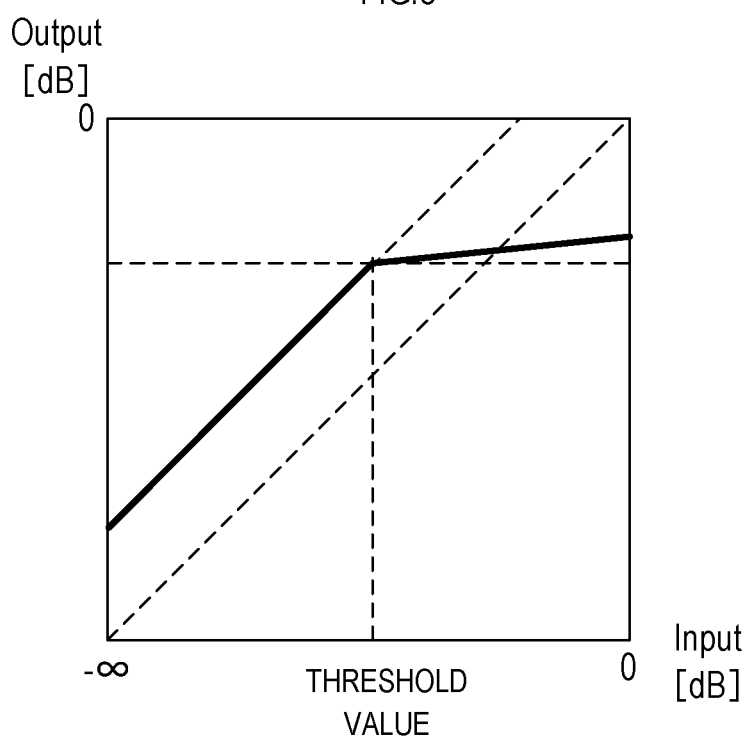
FIG. 8 illustrates an example of a gain table.

In addition, as illustrated in FIG. 8, in a low volume range, the value of the output level is increased to the value of the input level, and, in a case in which the value of the input level is not less than a threshold value [dB], the value of the output level is limited so that the change of the decibel value of the output level to the change of the decibel value of the input level may become a predetermined ratio (about 1/10, for example) greater than zero.

Figure 9A:
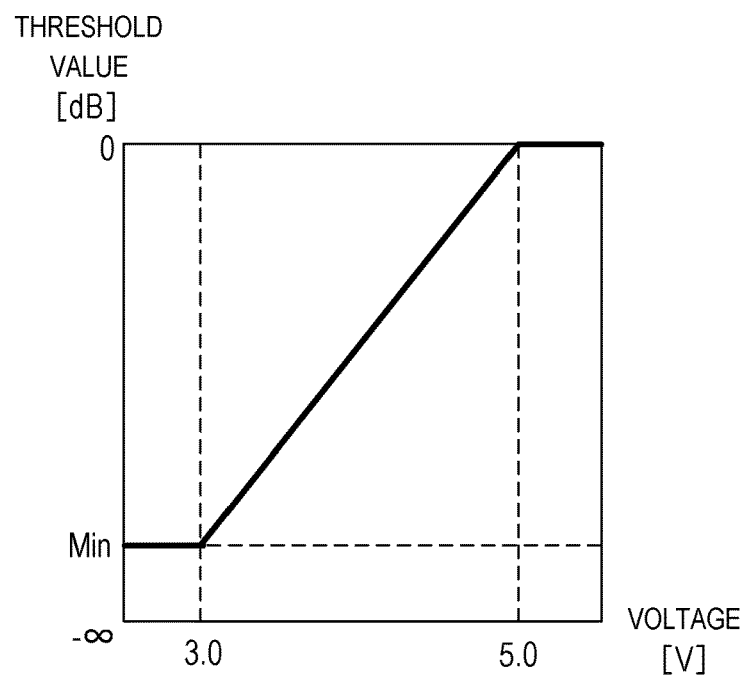
FIG. 9A illustrates an example of a conversion table.
Figure 9B:
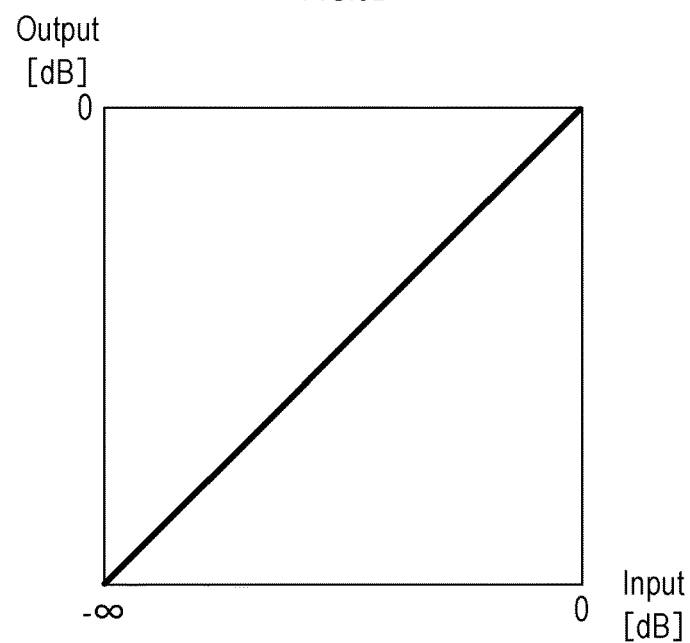
FIG. 9B illustrates an example of a gain table.

FIG. 9A illustrates a modification example of a conversion table. In the example of FIG. 9A, the conversion table 154, in a case in which the value of a voltage estimate value [V] is not less than 5 V, sets a threshold value to 0 [dB]. In such a case, as illustrated in FIG. 9B, the level of an input signal and the level of an output signal are directly proportional. In other words, the attenuation rate set in the gain adjuster 125 becomes the minimum value, and the processing of level limit is stopped. Thus, in a case in which the voltage of the capacitor 15 is high to some extent, the quality of sound does not change at all.

It is to be noted that, as illustrated in FIG. 11, the setting portion 150 may be configured by a program 175 that a CPU 171 executes. The CPU 171 reads the program 175 stored in a memory 172 and performs processing in the setting portion (a setting task) 150. In addition, the CPU 171 may read the program stored in the memory 172 and may perform processing in the level limiting portion (a level adjusting task) 120. In addition, the setting portion 150 and the level limiting portion 120 may be configured by respective different processors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal processing apparatus, comprising:
at least one processor configured to implement stored instructions and execute a plurality of tasks including:
a level adjusting task including inputting an input signal, outputting an output signal, wherein the input signal is an audio signal and the output signal is an audio signal, and
adjusting a level of the input signal, and a setting task calculating an electric charge estimate value being a value obtained by estimating an electric charge amount of a charging and discharging element based on an electric charge supplied to the charging and discharging element and a consumption electric charge calculated by a level of the output signal and setting an adjustment coefficient of the level adjusting task based on the electric charge estimate value.

2. The signal processing apparatus according to claim 1, further comprising the charging and discharging element to which a predetermined electric charge is supplied and in which the electric charge is held.

3. The signal processing apparatus according to claim 1, wherein the level adjusting task performs level limit.

4. The signal processing apparatus according to claim 1, wherein the setting task calculates the electric charge estimate value according to an integrated value obtained by integrating the electric charge supplied to the charging and discharging element and the consumption electric charge calculated by a level of the output signal.

5. The signal processing apparatus according to claim 1, wherein the consumption electric charge is calculated by multiplying the output signal and a consumption electric charge conversion coefficient that is set up previously.

6. The signal processing apparatus according to claim 1, wherein a voltage of the charging and discharging element is not detected.

7. A signal processing apparatus, comprising:
a level adjuster configured to receive an input signal, output an output signal, and adjust a level of the input signal; wherein the input signal is an audio signal and the output signal is an audio signal, and
a setter configured to calculate an electric charge estimate value being a value obtained by estimating an electric charge amount of a charging and discharging element based on an electric charge supplied to the charging and discharging element and a consumption electric charge calculated by a level of the output signal and setting an adjustment coefficient of the level adjuster based on the electric charge estimate value.

8. The signal processing apparatus according to claim 7, further comprising the charging and discharging element to which a predetermined electric charge is supplied and in which the electric charge is held.

9. The signal processing apparatus according to claim 7, wherein the level adjuster performs level limit.

10. The signal processing apparatus according to claim 7, wherein the setter calculates the electric charge estimate value according to an integrated value obtained by integrating the electric charge supplied to the charging and discharging element and the consumption electric charge calculated by a level of the output signal.

11. The signal processing apparatus according to claim 10, wherein the setter determines a maximum value of the integrated value according to a maximum capacity of the charging and discharging element.

12. The signal processing apparatus according to claim 10, wherein the setter, in a case in which the integrated value is not less than a predetermined value, holds the adjustment coefficient to a minimum value and stops the level limit.

13. The signal processing apparatus according to claim 10, wherein the setter, in a case in which the integrated value is less than or equal to the predetermined value, holds the adjustment coefficient to a maximum value.

14. The signal processing apparatus according to claim 13, wherein the maximum value is a value against which the consumption electric charge calculated by the level of the output signal and the electric charge supplied to the charging and discharging element are balanced.

15. A speaker apparatus, comprising:
the signal processing apparatus according to claim 7;
an input interface inputting a sound signal as the input signal to the level adjuster;

an amplifier circuit inputting the sound signal to which the level adjuster has performed level limit; and a speaker inputting the sound signal that has been amplified by the amplifier circuit.

16. A signal processing method comprising the steps of: inputting an input signal, outputting an output signal, wherein the input signal is an audio signal and the output signal is an audio signal, and Adjusting, by a processor, a level of the input signal; and calculating an electric charge estimate value being a value obtained by estimating an electric charge amount of a charging and discharging element based on an electric charge supplied to the charging and discharging element and a consumption electric charge calculated by a level of the output signal and setting an adjustment coefficient based on the electric charge estimate value.

17. The signal processing method according to claim 16, wherein the level adjustment is level limit.

18. The signal processing method according to claim 16, wherein the electric charge estimate value is calculated according to an integrated value obtained by integrating the electric charge supplied to the charging and discharging element and the consumption electric charge calculated by a level of the output signal.

19. The signal processing method according to claim 18, wherein a maximum value of the integrated value is determined according to a maximum capacity of the charging and discharging element.

20. The signal processing method according to claim 18, wherein, in a case in which the integrated value is not less than a predetermined value, the adjustment coefficient is held to a minimum value to stop the level limit.

21. The signal processing method according to claim 18, wherein, in a case in which the integrated value is less than or equal to the predetermined value, the adjustment coefficient is held to a maximum value.

22. The signal processing method according to claim 21, wherein the maximum value is a value against which the consumption electric charge calculated by the level of the output signal and the electric charge supplied to the charging and discharging element are balanced.

23. The signal processing method according to claim 16, wherein the consumption electric charge is calculated by multiplying the output signal and a consumption electric charge conversion coefficient that is set up previously.

24. The signal processing method according to claim 16, wherein a voltage of the charging and discharging element is not detected.

* * * * *